United States Patent
Smith

(10) Patent No.: US 10,283,365 B1
(45) Date of Patent: May 7, 2019

(54) TECHNIQUE AND RELATED SEMICONDUCTOR DEVICES BASED ON CRYSTALLINE SEMICONDUCTOR MATERIAL FORMED ON THE BASIS OF DEPOSITED AMORPHOUS SEMICONDUCTOR MATERIAL

(71) Applicant: GLOBALFOUNDRIES Inc., Grand Cayman (KY)

(72) Inventor: Elliot John Smith, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/810,638

(22) Filed: Nov. 13, 2017

(51) Int. Cl.
| | |
|---|---|
| *H01L 21/20* | (2006.01) |
| *H01L 29/78* | (2006.01) |
| *H01L 29/10* | (2006.01) |
| *H01L 21/02* | (2006.01) |
| *H01L 21/263* | (2006.01) |
| *C23C 14/58* | (2006.01) |

(52) U.S. Cl.
CPC ......... *H01L 21/2026* (2013.01); *C23C 14/58* (2013.01); *H01L 21/02343* (2013.01); *H01L 21/2636* (2013.01); *H01L 29/1033* (2013.01); *H01L 29/7848* (2013.01)

(58) Field of Classification Search
None
See application file for complete search history.

(56) References Cited

U.S. PATENT DOCUMENTS

| | | | |
|---|---|---|---|
| 6,656,270 B2 | 12/2003 | Chung | |
| 6,884,698 B1 * | 4/2005 | Ohtani | ............. H01L 21/02532 257/E21.133 |
| 7,919,366 B2 | 4/2011 | Jitsuno et al. | |
| 8,227,326 B2 | 7/2012 | Kim et al. | |

(Continued)

OTHER PUBLICATIONS

Kerdiles et al., "Dopant activation and crystal recovery in arsenic-implanted ultra-thin silicon-on-insulator structures using 308nm nanosecond laser annealing," 2016 IEEE.

(Continued)

*Primary Examiner* — Asok K Sarkar
(74) *Attorney, Agent, or Firm* — Amerson Law Firm, PLLC

(57) ABSTRACT

A method of forming a crystalline semiconductor material on the basis of a very thin semiconductor base material and an amorphous semiconductor material deposited thereon is disclosed. Radiation-based anneal process techniques may be applied by using appropriate radiation wavelengths, for instance, below 380 nm, in order to efficiently restrict energy deposition to the surface-near area. A solid and crystalline bottom portion of the semiconductor base material may be reliably preserved, thereby achieving crystallization of the overlying material portions and, in particular, of the previously deposited amorphous semiconductor material. Extremely thin channel regions of fully depleted SOI transistor elements may be used as a semiconductor base material, upon which raised drain and source regions may be formed in a later manufacturing stage, thereby substantially avoiding any process irregularities, which are conventionally associated with the epitaxial growth of a semiconductor material on a very thin semiconductor base material.

20 Claims, 3 Drawing Sheets

(56) References Cited

U.S. PATENT DOCUMENTS

| | | | |
|---|---|---|---|
| 2004/0060506 A1 | 4/2004 | Chung | |
| 2007/0178633 A1* | 8/2007 | Adetutu | H01L 21/823807 |
| | | | 438/199 |
| 2013/0288463 A1* | 10/2013 | Winkler | H01L 31/03682 |
| | | | 438/487 |
| 2015/0228487 A1* | 8/2015 | Neumayer | H01L 31/022425 |
| | | | 438/487 |

OTHER PUBLICATIONS

Mudgal et all., "Crystallization of Amorphous Silicon and Dopant Activation using Xenon Flash-Lamp Annealing (FLA)," Mater. Res. Soc. Symp, Proc., vol. 1666, 2014.

Tabata et al., "UV excimer laser annealing for next generation power electronics," 2016 IEEE.

* cited by examiner

TECHNIQUE AND RELATED SEMICONDUCTOR DEVICES BASED ON CRYSTALLINE SEMICONDUCTOR MATERIAL FORMED ON THE BASIS OF DEPOSITED AMORPHOUS SEMICONDUCTOR MATERIAL

BACKGROUND

1. Field of the Disclosure

Generally, the present disclosure relates to techniques and related semiconductor devices in which crystalline semiconductor materials, such as silicon, may be used in critical device areas, such as channel regions of sophisticated transistor elements and drain and source regions.

2. Description of the Related Art

Significant progress has been made in the field of semiconductor devices mainly due to the continuous reduction of critical dimensions of the basic components, such as transistor elements and the like. In particular, the shrinkage of transistor elements has enabled the fabrication of highly complex electronic devices, since more and more functions may be implemented within a single semiconductor chip of given lateral dimensions. In particular, sophisticated CMOS techniques have significantly contributed to the development of powerful, yet cost efficient, semiconductor products. In the CMOS technique, basic logic elements, such as inverters and/or NAND gates and the like, are formed on the basis of complementary transistor elements, i.e., field effect transistors of different conductivity type, which provide for a logic state on the basis of extremely reduced static losses, thereby rendering these complementary transistor elements highly advantageous for sophisticated control circuitry.

Basically, a field effect transistor may have a channel region, the conductivity of which may be appropriately controlled on the basis of a control voltage so as to establish a desired electric field in the channel region, which, in turn, may modulate the presence of charge carriers, thereby also appropriately modifying the conductivity of the channel region. Consequently, a more or less conductive current path may be established between respective transistor terminals, typically referred to as drain and source terminals or drain and source regions, thereby achieving various functions, for instance, establishing different voltage states by connecting a signal node to a respective reference voltage, such as the supply voltage and ground. An appropriate control voltage for modulating the conductivity of the channel region is typically applied on the basis of a so-called "gate electrode structure," which includes a dielectric material connecting to the channel region, followed by an electrode material which, in turn, may be connected to an appropriate control voltage source, such as ground, supply voltage and the like. Consequently, the modulation of the conductive state of the channel region may be accomplished by capacitive coupling, thereby substantially avoiding or at least significantly reducing any current flow between the drain and source regions and the gate electrode structure, except for charging the respective capacitances formed between the gate electrode structure and the drain and source regions.

Upon steadily reducing the dimensions of sophisticated field effect transistors, thereby contributing to increased operating speeds and reduced power consumption of any such transistor elements, many technological challenges have to be addressed so as to steadily improve overall performance of sophisticated semiconductor devices. For example, in sophisticated semiconductor devices, including powerful control circuitry possibly in combination with other functions, such as RF (radio frequency) capabilities, power applications and the like, small signal transistors, for instance, designed on the basis of a planar architecture wherein a gate length and, thus, a length of the channel regions formed between the respective drain and source regions, may have a dimension of approximately 30 nm and even less. When designing transistor elements on the basis of planar architecture and requiring reduced dimensions, other criteria may have to be taken into consideration in order to achieve reduced power consumption and high performance, in combination with overall reduced lateral dimensions.

For example, in sophisticated applications, the so-called SOI (silicon- or semiconductor-on-insulator) architecture may be frequently used, wherein the channel region and the drain and source regions may be formed on an insulating layer, frequently referred to as a buried insulating layer, so as to achieve a complete isolation of the transistor body region, i.e., the channel region and the drain and source regions, from any underlying substrate areas, thereby significantly reducing parasitic capacitance and, thus, enabling increased operating speeds of the respective transistor elements. Furthermore, in this context, performance of such transistors may be even further enhanced by substantially avoiding the presence of any charge carriers in the channel region when a corresponding control voltage is applied to the channel region, which is also referred to as a fully depleted state of the corresponding transistor element. A fully depleted configuration of the channel regions of sophisticated transistor elements, however, may require a very thin semiconductor material, such as a crystalline silicon material, having a thickness of, for example, 15 nm and even less, wherein such thin semiconductor base material layers may be typically formed by sophisticated wafer bond techniques and the like. On the other hand, forming drain and source regions, which may require high conductivity and, thus, a high dopant concentration in combination with a highly conductive contact region, is extremely difficult to achieve on the basis of the very thin semiconductor basic material, thereby requiring additional measures, such as epitaxial growth techniques in an advanced manufacturing stage so as to provide raised drain and source regions which may be doped in situ and which may provide the required height and, thus, process tolerance, so as to receive highly conductive metal-containing contact regions, such as metal silicide regions.

Upon further scaling the dimensions of such sophisticated transistor elements, however, it turns out that a further reduction of the thickness of the channel region may increasingly result in material irregularities during a corresponding epitaxial growth process in adjacent drain and source areas for forming a crystalline silicon material on a very thin silicon base material. For example, when performing epitaxial growth techniques on the basis of a very thin crystalline template material, agglomeration may take place, thereby practically preventing a required growth of crystalline semiconductor material. Therefore, in the context of sophisticated semiconductor devices requiring raised drain and source regions, the thickness of the semiconductor base material, used for forming the channel region, is restricted to a certain minimum value, thereby basically contributing to significant challenges in view of further reducing lateral dimensions of sophisticated, fully depleted transistor elements formed on the basis of an SOI architecture.

In view of the situation described above, the present disclosure relates to techniques for forming a crystalline semiconductor material on the basis of an underlying crystalline template material, while avoiding or at least reducing the effects of one or more of the problems identified above.

SUMMARY OF THE DISCLOSURE

The following presents a simplified summary of the disclosure in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is based on the concept that a crystalline semiconductor material may be formed on the basis of an underlying crystalline template material by depositing an amorphous semiconductor layer and initiating a conversion of the amorphous semiconductor layer into a crystalline semiconductor material, wherein the respective conversion into the crystalline semiconductor material may be accomplished by appropriately restricting a "penetration" depth of heat into the lower-lying template material, thereby also efficiently restricting the depth to which a melting of the template material may be initiated. Consequently, by reliably preserving at least a certain bottom layer of the initial template material, i.e., by restricting the melting process to a specified surface layer of the basic template material, it is guaranteed that an appropriate lattice template is available upon cooling the previously melted materials above the preserved bottom layer of the basic template material, thereby obtaining the desired crystalline semiconductor material. Due to the efficient control of the melt depth, in some illustrative embodiments, a reduced thickness of the basic template material may be selected so as to meet other device criteria, such as a desired thickness of channel regions of sophisticated, fully depleted transistor elements and the like, for example, when the basic template material may be formed on a buried insulating layer. In some illustrative embodiments disclosed herein, a desired control of heat penetration and, thus, melting of an underlying basic template material, may be accomplished by applying sophisticated, radiation-based anneal processes, for instance, in some illustrative embodiments, in the form of laser pulses of appropriate wavelength, pulse length and energy density.

One illustrative embodiment disclosed herein relates to a method. The method includes depositing an amorphous semiconductor layer on a crystalline semiconductor base layer formed above a substrate. Moreover, the method includes converting the amorphous semiconductor layer into a converted crystalline semiconductor material by exposing the amorphous semiconductor layer to radiation having a wavelength of 380 nm or less, so as to melt the amorphous semiconductor layer and a surface layer of the crystalline semiconductor base layer.

A further illustrative embodiment disclosed herein provides a method. The method includes depositing an amorphous semiconductor layer on a crystalline semiconductor layer base layer, wherein the crystalline semiconductor base layer is formed on an insulating layer and has a thickness of approximately 10 nm or less. Furthermore, the method includes melting the amorphous semiconductor layer and a surface layer of the crystalline semiconductor base layer while preserving a crystalline bottom layer of the crystalline semiconductor base layer. Additionally, the method includes cooling the amorphous semiconductor layer and the surface layer so as to form a converted crystalline semiconductor material from the amorphous semiconductor layer and the surface layer.

A still further illustrative embodiment disclosed herein provides a semiconductor device. The semiconductor device includes a gate electrode structure formed on a crystalline channel region so as to form an interface, wherein the channel region is formed on a buried insulating layer and has a thickness of approximately 7 nm or less. Moreover, the semiconductor device includes drain and source regions formed laterally adjacent to the gate electrode structure, wherein the drain and source regions are formed on the buried insulating layer and extend to a height level that is above a height level of the interface.

BRIEF DESCRIPTION OF THE DRAWINGS

The disclosure may be understood by reference to the following description taken in conjunction with the accompanying drawings, in which like reference numerals identify like elements, and in which.

Figure 1A:
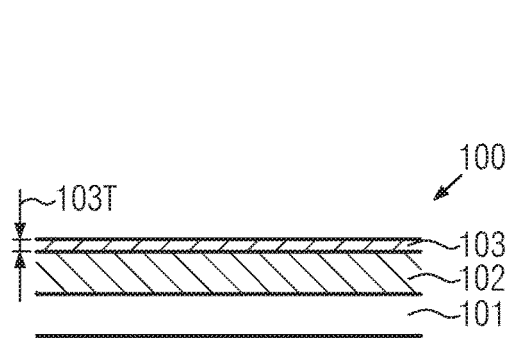
FIGS. 1A-1E schematically illustrate cross-sectional views of a semiconductor device during various manufacturing stages in forming a crystalline semiconductor material on the basis of a crystalline semiconductor base material layer and an amorphous semiconductor layer deposited thereon, according to illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios and numerical properties of ingredients, reaction conditions and so forth used in the specification and claims are to be understood as being modified in all instances by the term "about."

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

As briefly discussed above, typically, in sophisticated semiconductor devices, a crystalline semiconductor base material, for instance, silicon, silicon/germanium, silicon/carbon, and the like, may have to be used in critical device regions in order to provide superior performance due to increased charge carrier mobility and the like, compared to respective polycrystalline or substantially amorphous semiconductor materials. For example, it is well known that field effect transistors may be formed in a thin film of amorphous silicon material which, however, may suffer from significantly reduced performance compared to respective transistor elements formed on the basis of a crystalline silicon material. Therefore, forming a crystalline semiconductor material may be frequently required in the processing of sophisticated semiconductor devices. In other cases, an initially crystalline material damaged during the processing, for instance, upon substantially amorphizing the crystalline semiconductor material due to high dose doping based on implantation processes, may have to be returned to its crystalline structure. To this end, sophisticated anneal processes have been developed which may enter sufficient energy into the material under consideration so as to initiate a reconfiguration and, thus, recrystallization. In recent years, radiation-based anneal processes have been introduced into semiconductor production due to a number of advantages obtained by these techniques, such as extremely short radiation pulses, which may, therefore, enable a highly controlled introduction of radiation energy, thereby also providing a very short interaction time, which, on the one hand, may enable the reconfiguration of the crystalline structure on the basis of a surrounding template material, while, on the other hand, significant diffusion of atomic species may be avoided. That is, the short time interaction may result in an interaction of neighboring atoms only, while significant movement of atomic species may substantially not take place. In this manner, diffusion of dopant species, which may be frequently undesirable with respect to establishing a well-defined, precisely bound doped region, may be significantly reduced.

Furthermore, only surface-near areas of the corresponding substrate may be substantially heated by the incoming radiation, thereby spatially restricting the effect of the anneal process. For example, when a respective anneal process may have to be performed on a surface layer, any substrate areas positioned at a depth of 1 or several micrometers may experience only a non-critical rise in temperature and may, therefore, maintain their previously established material characteristics, while, on the other hand, in the surface of a surface-near area of the substrate, extremely high temperatures may be established that may result in a "melting" of respective areas, which, in turn, may provide the possibility of recrystallizing an amorphized surface portion. It should be appreciated that the term "melt" in the context of a radiation-based anneal process may generally describe the state of a material affected by the incoming radiation so as to enable a reconfiguration of the crystalline structure within a time frame that corresponds to the interaction time of the radiation and the semiconductor material, irrespective of whether or not an actual "fluid-like" state is generated in the semiconductor material. Consequently, as discussed above, for recrystallizing an amorphized semiconductor material on the basis of an anneal process, it is, nevertheless, required that a crystalline "template" material be in contact with the amorphized semiconductor material and that a portion of the template material preserves its stable crystalline structure so as to allow a recrystallization of adjacent, substantially "melted" portions upon solidification of the previously melted material portions.

In other well-established approaches, a thickness of a crystalline base material may be increased on the basis of epitaxial growth techniques in which appropriate deposition conditions may be established in order to ensure that respective species present in the gas phase adhere to the crystalline surface of the semiconductor base material substantially at lattice sites, thereby continuing the lattice structure that is present at the initial semiconductor surface. While the previously described process strategy based on anneal processes, such as radiation-based processes, may be highly advantageous in the context of recrystallizing amorphized semiconductor material as long as at least a certain amount of base material has been preserved during the previous processing, thereby requiring a previously formed semiconductor material of sufficient thickness, the latter technique based on epitaxial growth processes may provide more flexibility in increasing a thickness of a previously formed crystalline semiconductor base material. It turns out, however, that, as discussed above, a certain minimum thickness of the semiconductor base material seems to be necessary in order to avoid material irregularities, such as agglomeration, which may basically prevent the formation of a crystalline semiconductor material grown on a very thin semiconductor base material or at least add significant material irregularities to the newly grown material, thereby imposing severe limitations to the formation of, for instance, raised drain and source regions.

According to the principles disclosed herein, however, it has been recognized that sophisticated anneal processes, in particular, radiation-based processes, may be applied in combination with an amorphous semiconductor material deposited on a thin template material so as to form a crystalline semiconductor material, even if the semiconductor base material or template material may have to be provided with reduced thickness, for instance, in a thickness range which may result in conventional, well-established epitaxial growth techniques in agglomeration of deposited semiconductor material.

To this end, the penetration depth of heat sufficient to "melt" the amorphous semiconductor material deposited on the crystalline semiconductor base material may be controlled so as to reliably preserve a certain non-melted and, thus, stable and solid, template material, thereby enabling the transfer of the crystalline structure form the template materials into the overlying melted semiconductor material upon cooling the material compound. That is, it has been recognized that sophisticated anneal processes may provide pronounced energy transfer control so as to reliably preserve the required bottom layer of the template material within a range of approximately 10 nm and even less so that crystalline semiconductor material may be formed in high quality on a crystalline base material, irrespective of the thickness of the crystalline base material.

For example, laser-based anneal processes using a radiation wavelength of 380 nm and significantly less have been identified as appropriate means for efficiently restricting the heat absorption length or depth of the incoming radiation, thereby allowing the melting of surface layers having a thickness of several 10 nm down to 10 nm and even less. Moreover, radiation-based anneal processes may provide efficient control mechanisms for precisely controlling the heat absorption length to a specified target value for a given material system, for instance, by controlling energy density, wavelength, exposure time and the like. For example, in some illustrative embodiments, the radiation-based anneal process may be performed by using a laser radiation source, the pulse repetition rate, the energy density per pulse, the pulse length and the like, of which may be specifically adjusted so as to obtain the desired heat absorption length for a given material system.

Moreover, the base temperature of the material system under consideration may be appropriately adjusted, for instance, by heating the entire substrate carrying the material system under consideration so as to establish a well-defined base temperature, which may, therefore, be superimposed on the additional temperature rise obtained in the surface-near areas by the incoming radiation, thereby ensuring well-controlled conditions for heating and cooling of the newly crystallized material. In still other embodiments, a fine tuning of the heat absorption length and, thus, of the "melt depth," may be accomplished by appropriately adjusting material characteristics, such as the thickness of a layer to be exposed to radiation of the anneal process, wherein the layer may include a substantially amorphous semiconductor material, possibly in combination with one or more layers of different characteristics, thereby specifically designing the response to the radiation and providing superior conditions for the further processing, such as by imparting etch stop capabilities and the like to the material under consideration, if a lateral patterning of the crystalline material may be required in a later stage.

FIG. 1A schematically illustrates a cross-sectional view of a semiconductor device 100 which may comprise a substrate 101 that is appropriate for forming therein and/or thereon semiconductor devices in the form of transistor elements, capacitors and the like, in accordance with specified device requirements. For example, in sophisticated applications, the substrate 101 may be typically provided in the form of a crystalline semiconductor material, such as silicon, silicon/germanium, germanium, various compound semiconductor materials and the like. In other cases, the substrate 101 may comprise any other carrier material, such as glass, quartz and the like, depending on the overall requirements. In some illustrative embodiments, the substrate 101 may typically include crystalline silicon, since silicon is a well-established semiconductor material used in wide areas of semiconductor devices, in particular in the field of high performance, low cost semiconductor devices requiring sophisticated transistor elements for implementing highly advanced control circuitry and the like.

As previously discussed, in many situations, it may be required to provide a thin crystalline semiconductor layer above the substrate 101 so as to meet requirements of sophisticated devices, for instance, fully depleted transistor elements and the like. In the embodiment shown, a crystalline semiconductor material 103, in one illustrative embodiment a crystalline silicon material, may be formed above the substrate 101 and may have a desired thickness 103T that is selected in accordance with device requirements, requirements for the further processing and the like, as discussed above. It should be appreciated that the semiconductor layer 103, which may also be referred to as a crystalline semiconductor base layer, may be provided in this manufacturing stage with specific material characteristics, such as dopant concentration, type of doping and the like, in order to comply with criteria, for instance, with respect to fully depleted transistor elements still to be formed on the basis of the semiconductor layer 103. Moreover, in terms of material composition, it should be noted that the semiconductor layer 103 may also be provided in the form of a mixture of different atomic species, such as silicon/germanium, silicon/carbon and the like, if needed for specific types of circuit elements still to be formed.

As discussed above, in some strategies, the semiconductor base layer 103 may be provided with one appropriate thickness that meets at least the requirements of one type of semiconductor device, such as the characteristics of channel regions of fully depleted transistor elements, while, in other device areas, the characteristics of the semiconductor base layer 103 may have to be modified, for instance, in terms of dopant concentration, thickness, material composition and the like, wherein any such further modification, for instance, increasing the thickness of the base layer 103 in a later manufacturing stage, may result in significant process-related issues, for instance, in terms of re-growing a further crystalline semiconductor material on the basis of the semiconductor layer 103. For example, it has been recognized that, in particular, an epitaxial growth process based on a very thin base material may result in significant irregularities upon using a reduced thickness of the semiconductor base layer 103. Consequently, in some illustrative embodiments, the thickness 103T of the semiconductor base layer 103 may be selected to be approximately 7 nm and less, such as 6 nm and less, where conventional epitaxial growth techniques may encounter significant difficulties to reliably and repeatedly form a crystalline material on the base layer 103 by using epitaxial deposition techniques.

It should be appreciated, however, that although providing the semiconductor base layer 103 with a reduced thickness of 7 nm and less for forming highly sophisticated, fully depleted transistor elements, in other illustrative embodiments, the principles of the present disclosure may also be applied to a semiconductor base material having an increased thickness of greater than 7 nm, such as 10 nm, 15 nm, and more.

Although the semiconductor base layer 103 may, in some illustrative embodiments, represent a top surface of any appropriate substrate material, such as a crystalline substrate material, in some illustrative embodiments, the semiconductor base layer 103 may be formed on a buried insulating layer 102, which may have any appropriate material composition and thickness so as to comply with specific design and device requirements. For instance, the buried insulating layer 102 may be frequently provided in the form of an oxide material, such as silicon oxide, possibly in combination with other conventional dielectric materials, such as silicon nitride, silicon oxynitride and the like, while, in other illustrative embodiments, the buried insulating layer 102 may represent a material or material system for providing additional characteristics, such as a high dielectric constant using a so-called "high-k" dielectric material having a dielectric constant of 10 and higher, implementing polar characteristics, such as ferroelectricity and the like. By providing the buried insulating layer 102, at least locally in the semiconductor device 100, sophisticated, fully depleted SOI transistor elements may be formed in which a corresponding channel region may be formed on the basis of the semiconductor layer 103, which may be provided with the appropriate reduced thickness 103T required for highly sophisticated transistor elements of reduced dimensions, wherein, nevertheless, areas outside respective channel regions may still be appropriately treated, for instance, by increasing the initial thickness 103T on the basis of an amorphous semiconductor material, which may be crystallized by using the initial semiconductor layer 103 as a growth template.

Figure 1B:
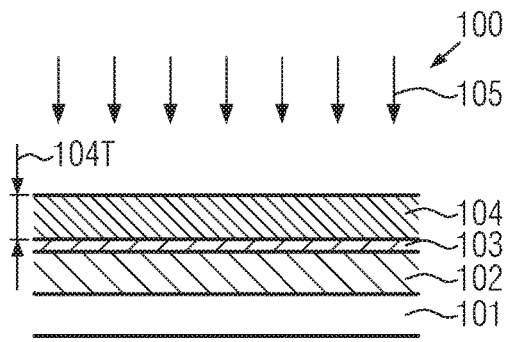

FIG. 1B schematically illustrates the semiconductor device 100 in a manufacturing stage in which the semiconductor device 100 may be subjected to a process or process sequence 105, which includes at least one deposition process for forming an amorphous semiconductor layer 104 on the semiconductor base layer 103. To this end, at any appropriate point in time of the overall process flow, the semiconductor layer 103 may be appropriately treated, for instance, a cleaning process may be applied, so as to prepare the surface of the layer 103 for the subsequent deposition of the amorphous semiconductor material 104. Thereafter, the process or process sequence 105 may be continued by establishing an appropriate deposition ambient based on well-established deposition recipes for depositing a desired semiconductor material, for instance, silicon, germanium and the like, on the base layer 103 in accordance with device requirements. During the respective deposition process during the process or process sequence 105, process parameters may be selected so as to obtain a desired thickness 104T, which, in some illustrative embodiments, may be in the range of approximately 5-25 nm so as to obtain a desired final thickness for the combined layers 103, 104, wherein it is to be noted that the volume of the amorphous semiconductor layer 104 may change upon crystallizing at least a portion of the material 104. In some illustrative embodiments, the process or process sequence 105 may be performed on the basis of a deposition process in which one or more appropriate dopant species may be introduced into the layer 104, if considered appropriate for the further processing of the device 100. In other cases, a surface treatment may be applied during the process or sequence 105 so as to introduce dopant species near the surface of the layer 104, for instance, on the basis of a plasma treatment and the like.

Figure 1C:
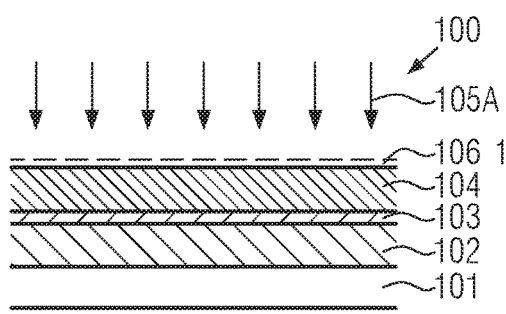

FIG. 1C schematically illustrates the semiconductor device 100 according to further illustrative embodiments in which the process sequence 105 (FIG. 1B) may include at least one process 105A designed to significantly modify surface characteristics of the layer 104. For example, in some illustrative embodiments, the process 105A may represent a deposition process for forming any appropriate material so as to impart different characteristics to the material system of the layers 104, 106 in terms of optical response to an exposure wavelength to be applied in a later manufacturing stage so as to crystallize at least a significant portion of the layer 104, provide superior masking or etch stop characteristics and the like. For example, the process 105A may represent a deposition process for forming a silicon nitride material, a silicon dioxide material, or any other material or material composition that may provide the required characteristics of the layers 104, 106. In other cases, the process 105A may represent an oxidation process performed on the basis of a highly controllable process technique, for instance, on the basis of wet chemical oxidation recipes, furnace-based processes and the like, in order to form a semiconductor oxide material with well-defined thickness for the layer 106.

Generally, it is to be noted that, during the process or sequence 105, the thickness 104T may be controlled with high precision and repeatability so as to address the requirements for the further processing, in particular, with respect to an optical response of the layers 104, 103 upon forming a crystalline material, at least from a portion of the layer 104. That is, for given process parameters in the subsequent processing, the thickness 104T and, if provided, the thickness of the layer 106, may be adapted with high precision to the requirements of the subsequent crystallization process so as to reliably maintain a portion of the layer 103 acting as a template. To this end respective experiments may be readily performed on the basis of given process parameters for the subsequent crystallization process so as to obtain the desired effect. Similarly, if provided, the influence of the layer 106 may be determined by experiment and may be used for enhancing further processing and/or appropriately adjusting the optical response of the layers 103, 104 upon being irradiated with radiation energy so as to initiate the crystallization of a significant portion of the layer 104.

Figure 1D:
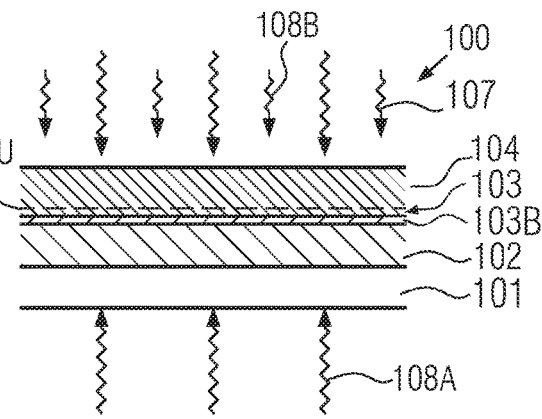

FIG. 1D schematically illustrates the semiconductor device 100 in a further advanced manufacturing stage in which the amorphous layer 104 and, if provided, the layer 106 (FIG. 1C), may be exposed to a process ambient 107 that is designed so as to introduce energy at least into the layer 104 so as to initiate crystallization of at least a significant portion of the material 104, while still preserving a portion of the layer 103 acting as a crystallization template. In one illustrative embodiment, the process 107 may be a radiation-based anneal process, wherein an absorption coefficient of the radiation of the process 107 may be moderately high with respect to the material system of the layers 104, 103.

To this end, in one illustrative embodiment, the radiation 107 may be selected within a wavelength range of 380 nm and less, thereby obtaining a moderately high absorption coefficient for silicon material compared to other wavelengths, for instance, a wavelength of 400 nm and higher. Consequently, by using the above-specified short wavelength, which corresponds to UV radiation, a significant amount of energy may be absorbed within the layers 104, 103, and possibly 106, if provided, thereby significantly locally increasing the temperature of the layers 104 and at least a portion of the layer 103 so as to initiate a "melting" of these materials, i.e., achieving a state in which re-configuration of the "lattice" structure may be accomplished. For example, laser sources may be available having a wavelength of 320 nm and even less, for instance 308 nm, which may be provided in the form of radiation pulses, wherein energy deposition and temperature profile may be controlled such that at least a bottom layer 103B of the semiconductor base layer 103 may remain in a solid crystalline state, while a surface portion 103U of the layer 103 may be "melted" together with the material of the layer 104. Consequently, by controlling energy density, for instance, based on pulse length, i.e., duty cycle, the process of heating the relevant portions 103U, 104 and possibly 106, if provided, may be appropriately controlled so as to preserve the bottom portion 103B, even if this bottom layer has a thickness of a few nm. To this end, for given material characteristics and layer thickness values of the optional layer 106, the layer 104 and the layer 103, the respective process parameters of the radiation-based anneal process 107 may be determined by experiment. When using a laser device as radiation source for the process 107, the process parameters may even be locally changed so as to take into consideration respective modifications of the materials 103, 104 when provided in different forms across the semiconductor device 100.

In further illustrative embodiments, the energy deposition and, thus, the spatial and temporal temperature profile in the material system 104, 103 may be additionally controlled by adjusting a certain base temperature in the layers 103, 104 so that, in addition to the energy provided by the process 107, the respective "threshold" for crystallization may be achieved, thereby also providing an efficient control mechanism for reliably maintaining the bottom portion 103B in its solid and crystallized configuration. For example, as previously discussed, the initial thickness 103T (see FIG. 1A) may, in sophisticated applications, be selected to be 7 nm and even less, so that within the thickness 103T of the layer 103, a corresponding interface between melted material of the layer 103 and solid crystalline material of the bottom portion 103B has to be preserved. For otherwise given parameters of the process 107 and for a given configuration of the material system, applying a certain "bias" energy and, thus, temperature, to the material system may thus allow for adjusting the interface between the upper portion 103U and the bottom portion 103B within the layer 103, even if provided with a reduced thickness as specified above.

In some illustrative embodiments, the bias energy deposition may be accomplished on the basis of a heating process 108A, which may be performed from the bottom of the substrate 101, for instance, using temperature controllable substrate stages. In addition or alternatively to the bottom heating mechanism on the basis of the process 108A, a further radiation-based process 108B, for instance, based on flashlight and the like, may be applied, wherein the radiation's absorption coefficient may be reduced compared to the process 107, thereby providing a relatively uniform energy distribution ranging into a depth that may be significantly greater compared to the energy deposition accomplished during the process 107. For example, a radiation source with a longer wavelength, for instance, in the range of 400 nm and significantly higher, may be used so as to deposit energy within a depth range of several hundred nanometers to several micrometers, thereby also achieving a certain base or bias temperature in the material systems 103, 104.

It should be appreciated that appropriate parameters for the process 107 and the processes 108A, 108B, if applied, may be readily established by performing experiments in which the effect of the various process parameters on the crystallization result may be studied on the basis of cross-sectional analysis and the like, so as to evaluate the quality of the final semiconductor material obtained from the layers 103 and 104.

Figure 1E:
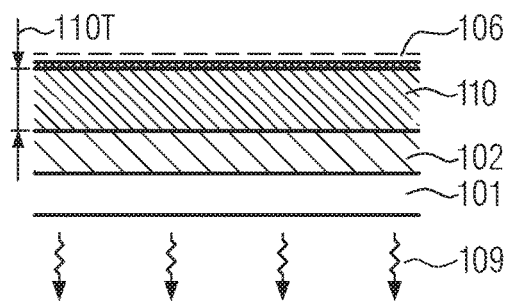

FIG. 1E schematically illustrates the semiconductor device 100 in a further advanced manufacturing stage in which the material system 103, 104, possibly in combination with the optional layer or layers 106 (see FIGS. 1C, 1D) may be cooled down so as to solidify and form a substantially crystalline layer 110, which may be covered by the optional layer 106, the characteristics of which may have been modified, depending on the initial material composition and configuration. In some illustrative embodiments, the solidifying and, thus, crystallization, so as to form the converted crystalline semiconductor material 110 may be accomplished on the basis of an active cooling process 109, which may be accomplished by any appropriate mechanism, for instance, using temperature controllable substrate stages and the like. It should be appreciated that active cooling is to be understood as any process in which a temperature ambient around the semiconductor device 100 may be established that provides stable temperatures below a predetermined threshold temperature, for instance, room temperature. For example, an inert gas atmosphere may be established with a temperature of well below 20° C., if desired, in combination with a respectively temperature-controlled substrate stage, thereby contributing to reduced overall process time. In other cases, even radiation cooling may be implemented under vacuum conditions, wherein, preferably, the material 110 radiates energy to the surroundings, which may be kept at a relatively low temperature by black body or gray body radiation.

It should be appreciated that establishing a base temperature or bias temperature during the process 107 (FIG. 1D) may also be considered as an active cooling, since, in this case, the base temperature may be selected to be lower than the actual melting temperature of the material systems 104, 103 while still inducing a stable temperature, thereby also contributing to a well-controlled cooling rate upon solidifying the melted material and, thus, forming the converted crystalline semiconductor material 110. In this manner, highly controllable process conditions during the process 107 and the subsequent solidification and, thus, crystallization, may be established, even if the process 107 may have to be performed as a scanning process, wherein the conditions for crystallizing the amorphous semiconductor layer 104 (see FIG. 1D) may be generated in a spatially and temporally restricted manner.

As a consequence, by applying a radiation-based anneal process, such as the process 107 (FIG. 1D) with a reduced "penetration depth," a crystalline template material may be used with reduced thickness, for instance, with approximately 7 nm and even less, while still providing the potential for reliably and repeatedly positioning the interface between solid crystalline material and liquid or melted material within the available thickness range, thereby enabling the crystallization of an overlying substantially amorphous semiconductor material. If desired, the process sequence of depositing a substantially amorphous semiconductor material and crystallizing the same by a radiation-based process may be repeated, possibly with different process parameters, if considered appropriate, thereby obtaining a desired final thickness for the further processing. In other cases, the converted crystalline semiconductor material 110 may provide a basis for performing other well-established processes for increasing the thickness of a crystalline material 110, for instance, on the basis of epitaxial growth techniques, which may be performed on the basis of well-established recipes, since the thickness of the base material 110 may be well above a critical value, such as approximately 7-10 nm.

With reference to FIGS. 2A-2L, further illustrative embodiments will now be described in which a transistor element may be formed on the basis of deposited amorphous semiconductor material, which may be crystallized at any appropriate manufacturing stage.

Figure 2A:
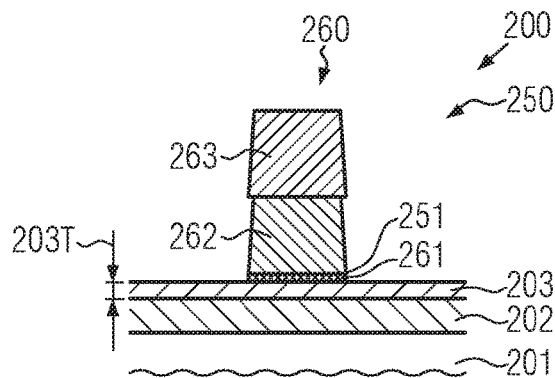
FIGS. 2A-2L schematically illustrate cross-sectional views of a semiconductor device according to various manufacturing stages in forming a sophisticated transistor element, including an extremely thin crystalline channel region and raised drain and source regions formed on the basis of a crystallized amorphous semiconductor material followed by an epitaxial growth process, according to further illustrative embodiments.

FIG. 2A schematically illustrates a cross-sectional view of a semiconductor device 200 in a manufacturing stage in which a gate electrode structure 260 of a transistor element 250 may be formed on a semiconductor base layer 203. The semiconductor base layer 203 may have any appropriate characteristics in terms of material composition, layer thickness and the like so as to serve as a base material for a channel region 251 of the transistor element 250. As previously discussed, in sophisticated applications, the channel region 251 may require a substantially fully depleted configuration, which may be accomplished by ensuring a reduced thickness 203T of the layer 203, as already discussed above in the context of the semiconductor device 100. In some illustrative embodiments, the layer 203 may comprise crystalline silicon, crystalline silicon/germanium, with a thickness of approximately 10 nm and less, while, in specific embodiments, the thickness 203T may be selected to be 7 nm and even less. Furthermore, in some illustrative embodiments, the transistor element 250 may be formed on the basis of an SOI architecture in which a buried insulating layer 202 may be formed below and in contact with the semiconductor base layer 203, at least locally. As also discussed above, the buried insulating layer 202 may have any appropriate material composition and thickness in accordance with device requirements. Furthermore, a substrate 201 of any appropriate configuration may be provided, for instance, in the form of a crystalline semiconductor material and the like.

The gate electrode structure 260 may basically comprise a gate dielectric material 261 formed on the channel region 251 and providing a desired degree of capacitive coupling in accordance with design criteria. To this end, the gate dielectric material 261 may have any appropriate configuration and may comprise silicon dioxide, silicon nitride, silicon oxynitride, high-k dielectric materials and the like, depending on the requirements imposed on the transistor element 250. Furthermore, the gate electrode structure 260 may comprise an electrode material 262, possibly in combination with any conductive barrier materials, threshold voltage-adjusting materials and the like. For instance, amorphous silicon, polysilicon, titanium nitride, tantalum nitride and the like may be frequently used in sophisticated gate electrode structures. Moreover, in this manufacturing stage, a capping material 263, for instance in the form of silicon nitride and the like, may be formed above the electrode material 262.

The semiconductor device 200 as illustrated in FIG. 2A may be formed on the basis of well-established process techniques, wherein, in particular, the semiconductor base layer 203 may be provided in the form of an SOI substrate in combination with the layer 202 and substrate 201, wherein, if required, any additional process steps may be applied so as to obtain the desired material composition and layer thickness, at least locally, for instance, for meeting the requirements for the channel region 251 for at least one type of transistor element 250 to be formed in the semiconductor device 200. For example, the semiconductor base layer 203 may be provided with an initial thickness that meets the criteria of those transistor elements that require the minimal thickness for the respective channel regions. In other device areas, a highly controlled "growth" of additional crystalline material may be initiated by performing the process sequence as described in the context of FIGS. 1A-1E, for instance, when the initial thickness 203T may not allow epitaxial growth of a further semiconductor material on the basis of well-established process recipes. In particular, when a scanning radiation process, such as a laser-based anneal process, may be used as discussed above in the context of the process 107 (FIG. 1D), any desired final layer thickness may be obtained in respective local areas of the semiconductor device 200 so as to meet the requirements for any other circuit elements.

Next, the gate electrode structure 260 may be formed by depositing appropriate dielectric material(s) and/or performing a respective surface treatment, followed by the deposition of the one or more electrode materials 262 and the capping layer 263. Thereafter, highly sophisticated patterning strategies may be applied so as to finally pattern the gate electrode structure 260 with respective critical dimensions. For instance, a corresponding gate length, i.e., in FIG. 2A, the horizontal extension of the electrode material 262 or the gate dielectric material 261, may be in the range of 30 nm and significantly less, such as 24 nm, in sophisticated applications.

Figure 2B:
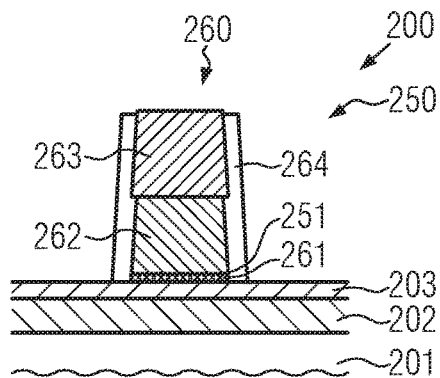

FIG. 2B schematically illustrates the semiconductor device 200 in a manufacturing stage in which the gate electrode structure 260 may comprise sidewall spacers 264, for instance, provided in the form of a silicon nitride material, a silicon dioxide material, a low-k dielectric material and the like, which may be accomplished by depositing one or more appropriate materials and etching the material by highly anisotropic etch techniques, thereby substantially removing the spacer material from horizontal device areas, while preserving the sidewall spacers 264.

Figure 2C:
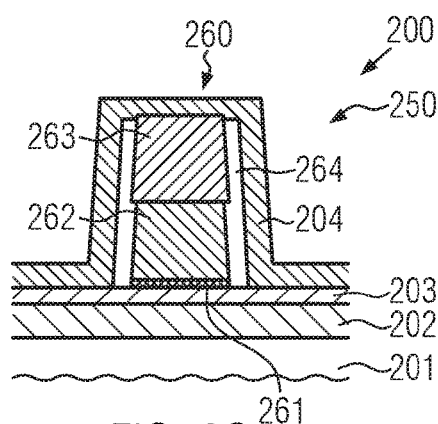

FIG. 2C schematically illustrates the semiconductor device 200 after deposition of an amorphous semiconductor layer 204, for instance, an amorphous silicon layer having an appropriate thickness so as to form, in a later manufacturing stage, a crystalline semiconductor material of increased thickness. The amorphous semiconductor layer 204 may be deposited on the basis of well-established recipes and using an appropriate precursor material, wherein respective cleaning processes may also precede the deposition process in order to appropriately prepare exposed surface areas of the semiconductor base layer 203 for the subsequent deposition of the amorphous semiconductor material 204. In some illustrative embodiments, the material 204 may be provided as a highly doped material, which may be accomplished by introducing an appropriate dopant species into the deposition ambient, while, in other cases, the deposition of the material 204 may be followed by an implantation process so as to incorporate a respective dopant species into the layer 204, while, on the other hand, selecting process parameters such that at least a significant portion of the semiconductor base layer 203 may remain intact with respect to its lattice structure. To this end, appropriate energy values for the implantation process may be selected, which may be accomplished by experiment, simulation calculation and the like.

Figure 2D:
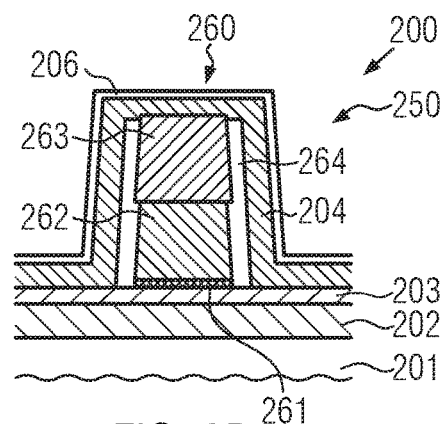

FIG. 2D schematically illustrates the semiconductor device 200 according to illustrative embodiments in which an additional cover layer or liner 206 may be formed on the amorphous semiconductor layer 204. To this end, a further deposition process may be performed and/or a surface treatment may be applied, for instance, in the form of an oxidation process, a nitridation process and the like. It should be appreciated that, as already discussed above in the context of the semiconductor device 100, the thickness of the layer 204 and of the optional cover layer 206 may be selected in consideration of optical response, masking characteristics and the like in order to comply with the further processing of the device 200 and obtaining a desired crystalline material of increased thickness.

In some illustrative embodiments, it may be considered advantageous to remove the amorphous semiconductor material 204 from at least a significant portion of the gate electrode structure 260 prior to actually crystallizing the amorphous semiconductor layer 204 during the further processing. In other cases, the process of converting the amorphous semiconductor material 204 into a crystalline material may be performed prior to removing any excess material from above the gate electrode structure 260, depending on the overall process strategy.

Figure 2E:
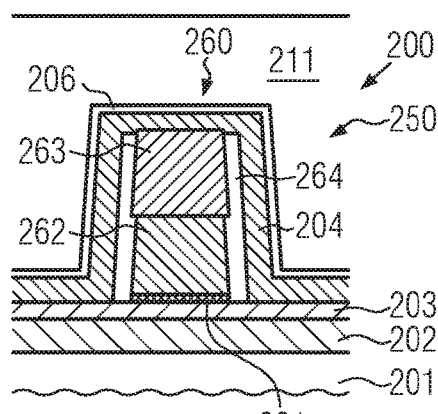

FIG. 2E schematically illustrates the semiconductor device 200 in accordance with illustrative embodiments in which significant portions of the amorphous semiconductor material 204 may be removed prior to performing a radiation-based crystallization process. As illustrated, the surface typography caused by the presence of the gate electrode structures 260 may be planarized by depositing any appropriate fluid-like material 211, such as an organic or polymer material, which may be applied by spin-on techniques and the like. If required, a further planarization of the material 211 may be performed, for instance, by using a top surface of the gate electrode structure 260 for controlling the respective process. In other cases, the planarization may be continued so as to expose a significant portion of the gate electrode structure 260 and, thus, of the layer 206.

Figure 2F:
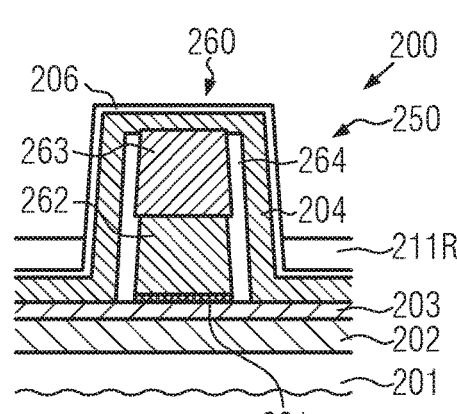

FIG. 2F schematically illustrates the semiconductor device 200 after having removed a significant portion of the planarization material, while preserving a portion 211R thereof that may reliably cover horizontal portions of the layers 206, 204. A corresponding material removal may be accomplished by well-established, plasma-based removal processes, wherein the portion 211R may be preserved with a thickness of approximately 5-20 nm, depending on overall device and process requirements. It should be appreciated that appropriate parameters for controlling the process of recessing the material 211 (FIG. 2E) may be readily established on the basis of experiments and the like.

Figure 2G:
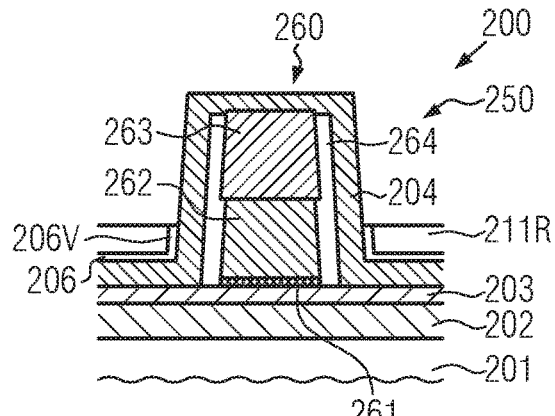

FIG. 2G schematically illustrates the semiconductor device 200 in a further manufacturing stage in which an exposed portion of the layer 206 (FIG. 2F) may be removed, which may be accomplished by an appropriate wet chemical or plasma-assisted etch process, wherein the material 211R may act as a mask material. For example, a plurality of highly efficient etch recipes for removing silicon nitride, silicon dioxide and the like are well known in the art and may be used for removing the exposed portions of the layer 206. Depending on the etch characteristics of the material 211R, a significant part of the vertical portion 206V may also be removed, for instance, by applying a certain over-etch time, changing the etch parameters so as to substantially commonly remove the material 211R and material of the layer 206, and the like. Thereafter, the remaining portion of the material 211R may be removed, for instance, by plasma-assisted etch recipes, wet chemical processes and the like.

Figure 2H:
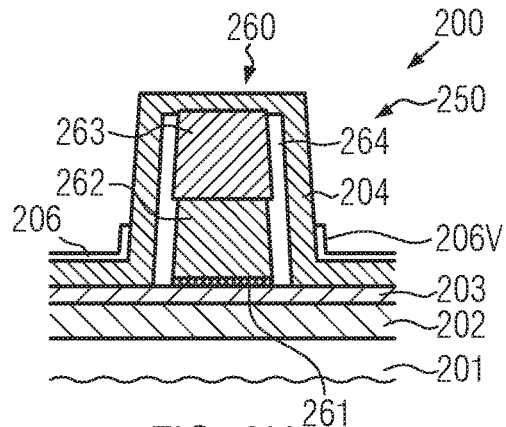

FIG. 2H schematically illustrates the semiconductor device 200 after the removal of the material 211R, wherein the layer 206 may still reliably cover horizontal portions of the amorphous semiconductor layer 204, while on sidewalls and the top surface of the gate electrode structure 260, the material 204 may be exposed and a vertical extension of the portion 206V may be adjusted, as considered appropriate and discussed above.

Figure 2I:
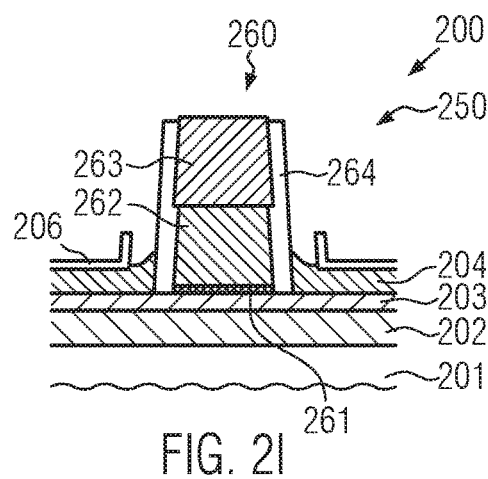

FIG. 2I schematically illustrates the semiconductor device 200 after the removal of exposed portions of the amorphous semiconductor material 204, which may be accomplished on the basis of well-established wet chemical and/or plasma-assisted etch recipes, while the cover layer 206 may act as a mask or etch stop material so as to reliably preserve the underlying amorphous semiconductor material 204. For example, amorphous silicon material may be efficiently removed on the basis of ammonia, while, however, any other appropriate process parameters may be readily determined on the basis of experiments, depending on the material composition of the amorphous semiconductor material 204 and the cover layer 206.

Figure 2J:
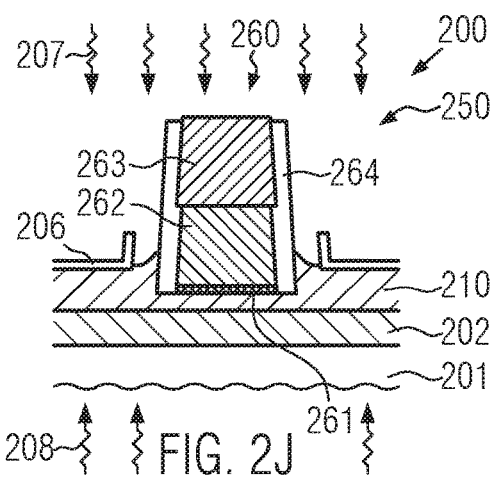

FIG. 2J schematically illustrates the semiconductor device 200 according to illustrative embodiments in which a radiation-based anneal process 207 may be performed so as to crystallize at least a significant portion of the amorphous semiconductor layer 204 on the basis of the underlying semiconductor base material 203 (see FIG. 2I). To this end, appropriate process parameters may be adjusted for given values of the layer thickness of the layer 204, the layer 203 and the cover layer 206 in order to increase the surface temperature to a sufficiently high value so as to initiate a melting of the layer 204, while preserving a solid and crystalline bottom portion of the layer 203, as is also previously discussed in the context of the radiation-based anneal process 107 of FIG. 1D. Consequently, as also discussed above, the laser-based anneal process 207, for instance, performed on the basis of radiation of a wavelength of 380 nm and less, may be accompanied by a temperature controlling process 208, which may result in a certain base or bias temperature of the surface of the semiconductor device 200, for instance, by using a temperature controllable substrate stage, additional radiation having a reduced absorption coefficient and, thus, increased penetration depth compared to the radiation applied during the process 207, and the like. Moreover, as also previously discussed, the base or bias temperature may, in some illustrative embodiments, also be selected so as to provide active cooling of the semiconductor device 200, so as to initiate accelerated crystallization of previously liquefied semiconductor material, thereby obtaining a converted crystalline semiconductor material 210 having a thickness that depends on the thickness of the layers 203 and 204 (see FIG. 2I).

It should be noted that, during the radiation-based anneal process 207, the characteristics of the cover layer 206 may also be taken into consideration for adjusting the optical response and, thus, for controlling the actual melt depth during the process 207. For example, the material 206 may have a significantly higher melting temperature compared to the underlying amorphous semiconductor material, thereby substantially maintaining layer thickness and overall configuration during the process 207 or may be non-absorptive at the selected radiation wavelength.

Figure 2K:
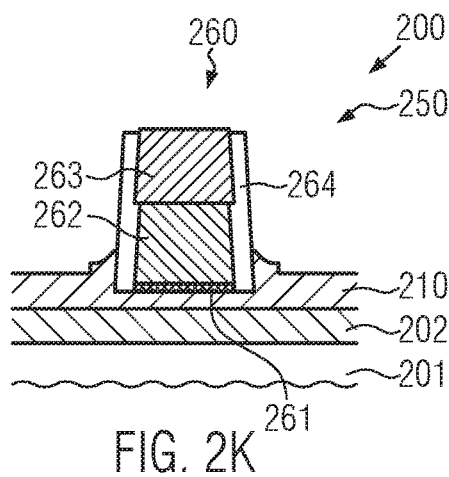

FIG. 2K schematically illustrates the semiconductor device 200 after the removal of the cover layer 206 (FIG. 2J), which may be accomplished on the basis of well-established plasma-assisted or wet chemical etch recipes.

In other illustrative embodiments, the cover layer 206 may be removed prior to performing the radiation-based anneal process 207 of FIG. 2J when the optical response of the cover layer 206 is considered inappropriate during the radiation-based process 207. That is, starting from the semiconductor device 200 as illustrated in FIG. 2I, the layer 206 may be removed and, thereafter, the radiation-based anneal process 207 may be carried out.

As discussed above, in other illustrative embodiments, the removal of undesired portions of the amorphous semiconductor layer 204 may be performed in a late manufacturing stage, and the processing may continue, starting from the configuration as shown in FIG. 2C, by applying the process 207 and subsequently removing non-desired portions of the resulting semiconductor material from the gate electrode structure 260, for instance, by performing the sequence as shown in FIGS. 2D-2I, by depositing the liner 206 and removing the semiconductor material 204 from the gate electrode structure 260.

In other illustrative embodiments, the process may start with the configuration as shown in FIG. 2D, i.e., with the liner or cover layer 206 in place, followed by the radiation-based anneal process 207, thereby taking into account the effects of the cover layer 206 on the process 207, and subsequently non-wanted portions of the material 204 may be removed, for instance, based on the process sequence as shown in FIGS. 2E-2I.

In some illustrative embodiments, the thickness of the converted crystalline semiconductor 210 (FIG. 2K) may be appropriate for the further processing, i.e., for forming therein drain and source regions of the transistor element 250 which may be accomplished by introducing additional dopant species when a corresponding dopant concentration of the material 210 is considered too low.

Figure 2L:
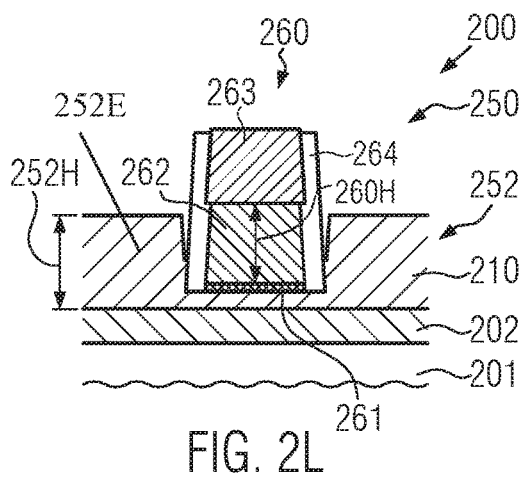

FIG. 2L schematically illustrates the semiconductor device 200 according to further illustrative embodiments in which the transistor 250 may comprise drain and source regions 252 having a height that exceeds the height or thickness of the previously formed crystalline semiconductor material 210. To this end, the semiconductor device 200 may be subjected to an epitaxial growth process in accordance with well-established recipes so as to form additional crystalline semiconductor material 252E based on the crystalline semiconductor material 210, wherein a desired degree of in situ doping may also be realized. Thus, in some illustrative embodiments, a height level 252H, defined by a top surface of the drain and source regions 252, may extend to at least half of a height level 260H of the gate electrode structure 260, i.e., a height level that is defined by an electrode material of the gate electrode structure 260, such as the one or more electrode materials 262. It should be appreciated that, in this manufacturing stage, any further conductive materials, such as conductive metal semiconductor compounds, such as nickel silicide, nickel/platinum silicide and the like, may not be provided yet. Any such materials may be formed in a later manufacturing stage, thereby possibly slightly changing the respective height levels 260H, 252H due to an increase of volume when forming respective metal semiconductor compounds. It should be noted, however, that the basic relations between the height levels 252H and 260H may still be preserved, even after having performed any such processes for providing highly conductive metal-containing contact regions in the gate electrode structure 260 after removal of the capping layer 263 and in the drain and source regions 252.

Consequently, the transistor element 250 may comprise the channel region 251 formed on the basis of the initial thickness 203T of the semiconductor base layer 203 (see FIG. 2A), which may, in some illustrative embodiments, be in the range of 7 nm and even less, while, on the other hand, raised drain and source regions 252 may be formed at least on the basis of the material 210, possibly in combination with additional epitaxially grown portions 252E. Thus, the transistor element 250 may represent a transistor configuration with an extremely thin channel region, which, nevertheless, provides the possibility of forming raised drain and source regions, while substantially avoiding any material irregularities or process irregularities, which are conventionally encountered during an epitaxial growth process for forming a crystalline semiconductor material on a very thin base or template material.

In the above-described embodiments, the gate electrode structure 260 is formed in an "early" manufacturing stage, i.e., a so-called "gate first" approach is applied, in which the gate dielectric layer 261, including one or more materials, and the gate electrode material 262, which may also include one or more different materials, are provided prior to forming the drain and source regions 252, without requiring a removal of one or more of these materials, except for the capping layer 263, in a later manufacturing stage, as may be the case in so-called replacement gate approaches, in which at least the electrode materials, and typically, one or more of the gate dielectric materials, are provided after removal of a dummy material in a late manufacturing stage after having formed the drain and source regions. Therefore, in such gate electrode structures, the removal of the dummy material and the subsequent deposition of a dielectric material, such as a high-k dielectric material and possibly a conductive barrier material, may result in the deposition of these materials on inner sidewalls of the previously generated opening and may therefore enclose a highly conductive gate electrode material. On the other hand, in the embodiments discussed above, the gate electrode material 262 is formed completely on the gate dielectric layer 261 so that each material layer of the gate dielectric layer 261, even if two or more different material layers are provided, and each material layer of the gate electrode material 262, even if two or more different electrode materials are provided, are laterally bordered by and thus in contact with the sidewall spacers 264.

It should be appreciated that, in other illustrative embodiments (not shown), a crystalline semiconductor material of increased thickness, such as in drain and source regions, may be provided in the context of transistor elements formed on the basis of a replacement gate approach, if considered appropriate.

As a result, the present disclosure provides manufacturing techniques and a resulting semiconductor device in which amorphous semiconductor material, for instance, silicon, may be formed on a template material and may be crystallized by a radiation-based anneal process, for instance, a laser-based process, using a radiation wavelength of 380 nm and less, thereby restricting the major energy deposition to a very thin surface layer. In this manner, even a very thin base material, for instance, provided as a thin semiconductor layer formed on an insulating material, may be used as a template during the crystallization of the amorphous semiconductor material, since a solid and crystalline bottom portion of the base or template material may be reliably preserved due to the high degree of controllability of the radiation-based anneal process, so that an interface between non-melted and melted material of the template or base material may be reliably positioned within the original semiconductor base layer. Consequently, the thin base semiconductor layer may be increased in thickness by a deposition process in combination with a well-controllable, radiation-based anneal process.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a short-hand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
depositing an amorphous semiconductor layer on a crystalline semiconductor base layer having a thickness of approximately 10 nm or less that is formed on a buried insulating layer, said buried insulating layer being formed above a substrate; and
converting said amorphous semiconductor layer into a converted crystalline semiconductor material, wherein converting said amorphous semiconductor layer comprises exposing said amorphous semiconductor layer to radiation having a wavelength of 380 nm or less so as to melt said amorphous semiconductor layer and a surface layer portion of said crystalline semiconductor base layer.

2. The method of claim 1, wherein converting said amorphous semiconductor layer into a crystalline semiconductor material further comprises actively cooling said substrate.

3. The method of claim 1, wherein said wavelength of said radiation is 320 nm or less.

4. The method of claim 1, further comprising controlling a melt depth in said crystalline semiconductor base layer by adjusting at least one of an energy density of said radiation, a length of pulses applied to expose said amorphous semiconductor layer to said radiation, a base temperature applied to said crystalline semiconductor base layer and a thickness of said amorphous semiconductor layer.

5. The method of claim 1, wherein said radiation is generated by a laser radiation source.

6. The method of claim 1, further comprising forming drain and source regions of a transistor element in portions of said converted crystalline semiconductor material.

7. The method of claim 6, wherein forming said drain and source regions comprises forming raised drain and source regions by epitaxially growing a semiconductor material on said portions of said converted crystalline semiconductor material.

8. The method of claim 6, further comprising forming a gate electrode structure on said crystalline semiconductor base layer prior to depositing said amorphous semiconductor layer.

9. The method of claim 8, further comprising removing said amorphous semiconductor layer from above said gate electrode structure prior to forming said drain and source regions.

10. The method of claim 6, further comprising forming a gate electrode structure on a portion of said converted crystalline semiconductor material.

11. The method of claim 1, wherein said radiation is a first radiation and said wavelength is a first wavelength, and wherein converting said amorphous semiconductor layer into said converted crystalline semiconductor material comprises at least one of:
applying a heating process to said substrate while exposing said amorphous semiconductor layer to said first radiation; and exposing said amorphous semiconductor layer to a second radiation having a second wavelength while exposing said amorphous semiconductor layer to said first radiation, said second wavelength being greater than said first wavelength.

12. A method, comprising:
depositing an amorphous semiconductor layer on a crystalline semiconductor base layer formed on a buried insulating layer and having a thickness of approximately 10 nm or less;
melting said amorphous semiconductor layer and a surface layer portion of said crystalline semiconductor base layer while preserving a crystalline bottom layer portion of said crystalline semiconductor base layer; and
cooling said amorphous semiconductor layer and said surface layer portion so as to form a converted crystalline semiconductor material from said amorphous semiconductor layer and said surface layer portion.

13. The method of claim 12, wherein melting said amorphous semiconductor layer and said surface layer portion of said crystalline semiconductor base layer comprises performing a radiation-based anneal process using radiation with a wavelength of 380 nm or less.

14. The method of claim 13, wherein preserving said crystalline bottom layer portion of said crystalline semiconductor base layer comprises controlling at least one of an energy density of said radiation, a length of pulses applied to melt said amorphous semiconductor layer, a base temperature of said crystalline semiconductor base layer prior to performing said radiation-based anneal process and a thickness of said amorphous semiconductor layer.

15. The method of claim 13, wherein said radiation-based anneal process is performed on the basis of laser radiation having a wavelength of 320 nm or less.

16. The method of claim 12, further comprising forming a cover layer on said amorphous semiconductor layer and melting said amorphous semiconductor layer in the presence of said cover layer.

17. The method of claim 16, further comprising removing a portion of said amorphous semiconductor layer by using said cover layer prior to melting said amorphous semiconductor layer.

18. The method of claim 12, further comprising forming raised drain and source regions of a transistor element on portions of said converted crystalline semiconductor material by epitaxial growth.

19. The method of claim 12, wherein melting said amorphous semiconductor layer and said surface layer portion of said crystalline semiconductor base layer comprises applying a bias energy to said amorphous semiconductor layer and said crystalline semiconductor base layer, wherein applying said bias energy comprises at least one of applying a heating process to a substrate on which said buried insulating material is formed and exposing said amorphous semiconductor layer to radiation having a wavelength greater than 380 nm.

20. The method of claim 12, further comprising forming a dielectric insulating material layer on an upper surface of said amorphous semiconductor layer, wherein at least a portion of said dielectric insulating material layer is present on said upper surface during said melting of said amorphous semiconductor layer and said surface layer portion of said crystalline semiconductor base layer.

* * * * *